United States Patent
Yoshikawa (10) Patent No.: US 9,143,111 B2
(45) Date of Patent: Sep. 22, 2015

(54) SIGNAL PROCESSOR, SIGNAL PROCESSING METHOD AND COMMUNICATION DEVICE

(71) Applicant: Sony Corporation, Tokyo (JP)

(72) Inventor: Naoto Yoshikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 109 days.

(21) Appl. No.: 13/867,148

(22) Filed: Apr. 22, 2013

(65) Prior Publication Data

US 2013/0314161 A1 Nov. 28, 2013

(30) Foreign Application Priority Data

May 28, 2012 (JP) ................................ 2012-120417

(51) Int. Cl.
*H03G 3/30* (2006.01)
*H03G 1/00* (2006.01)

(52) U.S. Cl.
CPC ........... *H03G 3/3036* (2013.01); *H03G 1/0029* (2013.01)

(58) Field of Classification Search
CPC ....................................................... H03G 3/30
USPC ........................................ 330/278, 254, 261
See application file for complete search history.

(56) References Cited

U.S. PATENT DOCUMENTS

| | | | | |
|---|---|---|---|---|
| 3,927,382 A | * | 12/1975 | Oki ................................ | 330/254 |
| 4,041,409 A | * | 8/1977 | Kominami et al. ........... | 330/254 |
| 4,287,476 A | * | 9/1981 | Cense ............................ | 330/254 |
| 6,018,270 A | * | 1/2000 | Stuebing et al. .............. | 330/278 |
| 6,650,883 B1 | * | 11/2003 | Stephane et al. .............. | 455/313 |
| 6,888,406 B2 | * | 5/2005 | Ashby et al. .................. | 330/254 |
| 7,215,186 B2 | * | 5/2007 | Whyte et al. .................. | 327/543 |
| 7,626,457 B2 | * | 12/2009 | Mudd et al. ................... | 330/254 |
| 8,050,649 B2 | * | 11/2011 | Chen et al. .................... | 455/326 |
| 2010/0138681 A1 | | 6/2010 | Kato | |

* cited by examiner

*Primary Examiner* — Henry Choe
(74) *Attorney, Agent, or Firm* — Sony Corporation (57) ABSTRACT

Disclosed herein is a signal processor including: a plurality of parallel-connected variable gain amplification sections with variable gains; and a control section adapted to control the potentials of control terminals of each of the variable gain amplification sections and make transitions in the control terminal potentials according to different input signal levels.

9 Claims, 10 Drawing Sheets

SIGNAL PROCESSOR, SIGNAL PROCESSING METHOD AND COMMUNICATION DEVICE

BACKGROUND

The present technology relates to a signal processor, signal processing method and communication device, and more particularly, to a signal processor that can provide improved linearity of the gain control characteristic, a signal processing method of the same and communication device having the same.

In related art, methods are available to use a variable gain amplifier with a variable gain as an amplification section installed at the RF (Radio Frequency) front end (refer, for example, to U.S. Ser. No. 10/138,681).

SUMMARY

In related art, however, the gain is controlled by the current division ratio between a pair of cascode transistors, possibly changing the linear gain control characteristic into a nonlinear one in the control process. This has resulted in insufficient distortion characteristic, possibly making it difficult to achieve a sufficient dynamic range.

The present technology has been proposed in light of the foregoing, and it is desirable to provide improved linearity of the gain control characteristic.

One mode of the present technology is a signal processor that includes a plurality of variable gain amplification sections and a control section. The plurality of variable gain amplification sections with variable gains are connected in parallel. The control section controls the potentials of control terminals of each of the variable gain amplification sections and make transitions in the control terminal potentials according to different input signal levels.

The control section can make transitions in the control terminal potentials of the variable gain amplification sections with potential differences established therebetween that allow the distortion components generated by the variable gain amplification sections to cancel out each other.

The control section can make transitions in the control terminal potentials of the variable gain amplification sections at predetermined voltage intervals.

The control section can change each of the control terminal potentials by the potential difference proportional to the change in the signal level.

All the variable gain amplification sections can include transistors of the same size.

Each of the variable gain amplification sections can include a pair of cascode transistors and vary the gain based on the current division ratio between the pair of cascode transistors. The control section can control the control terminal potentials in such a manner that the pair of cascode transistors are controlled in a differential manner.

Each of the variable gain amplification sections can include a differential amplification section adapted to amplify the difference between the pair of control terminal potentials.

Another mode of the present technology is a signal processing method of a signal processor. In the signal processing method, the signal processor monitors the input signal level, determines the potentials of control terminals of each of a plurality of parallel-connected variable gain amplification sections with variable gains and supplies the control terminal potentials to the control terminals of the variable gain amplification sections.

Still another mode of the present technology is a communication device that includes a reception section, a plurality of variable gain amplification sections and a control section. The reception section receives a signal. The plurality of variable gain amplification sections are connected in parallel and amplify the signal received by the reception section. The control section controls the potentials of control terminals of each of the variable gain amplification sections and makes transitions in the control terminal potentials according to the input signal levels that are different from each other.

In the mode of the present technology, the input signal levels are monitored. The potentials of control terminals of each of a plurality of parallel-connected variable gain amplification sections with variable gains are determined based on the input signal levels. The determined control terminal potentials are supplied to the control terminals of the variable gain amplification sections.

The present technology permits signal level control, and, in particular, provides improved linearity of the gain control characteristic, thus contributing to improved distortion characteristic.

DETAILED DESCRIPTION OF THE PREFERRED EMBODIMENTS

A description will be given below of the modes for carrying out the present disclosure (hereinafter referred to as the embodiments). It should be noted that the description will be given in the following order.
1. First embodiment (variable gain amplifier)
2. Second embodiment (receiver)
3. Third embodiment (display device)
4. Fourth embodiment (computer)

1. First Embodiment

1-1 Variable Gain Amplifier Including a Single Amplification Section

Figure 1:
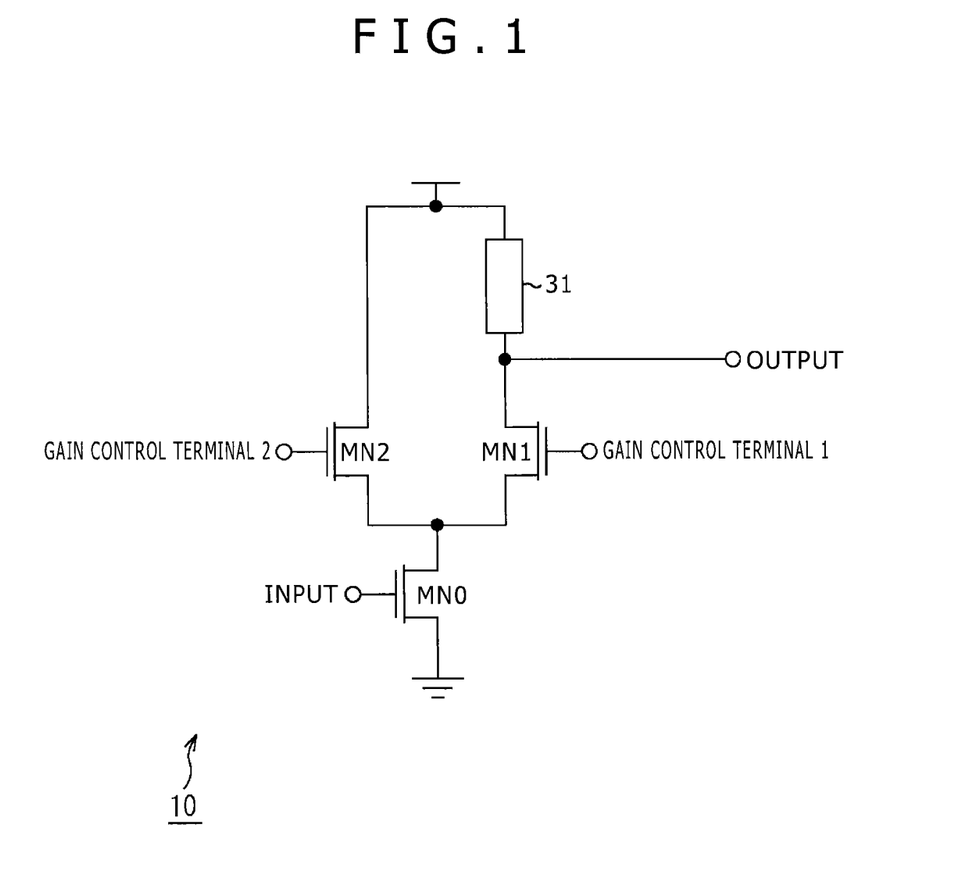
FIG. 1 is a diagram illustrating an example of main components of a variable gain amplifier.

FIG. 1 is a diagram illustrating an example of main components of a variable gain amplifier. A variable gain amplifier 10 shown in FIG. 1 can vary its gain. As illustrated in FIG. 1, the variable gain amplifier 10 includes three transistors MN0 to MN2 and a load 31. The transistors MN1 and MN2 are cascoded to the common transistor MN0, with the load 31 connected to the transistor MN1. The variable gain amplifier 10 as described above finds application, for example, as a low noise amplifier in a wireless communication system typified by a TV tuner.

Figure 2:
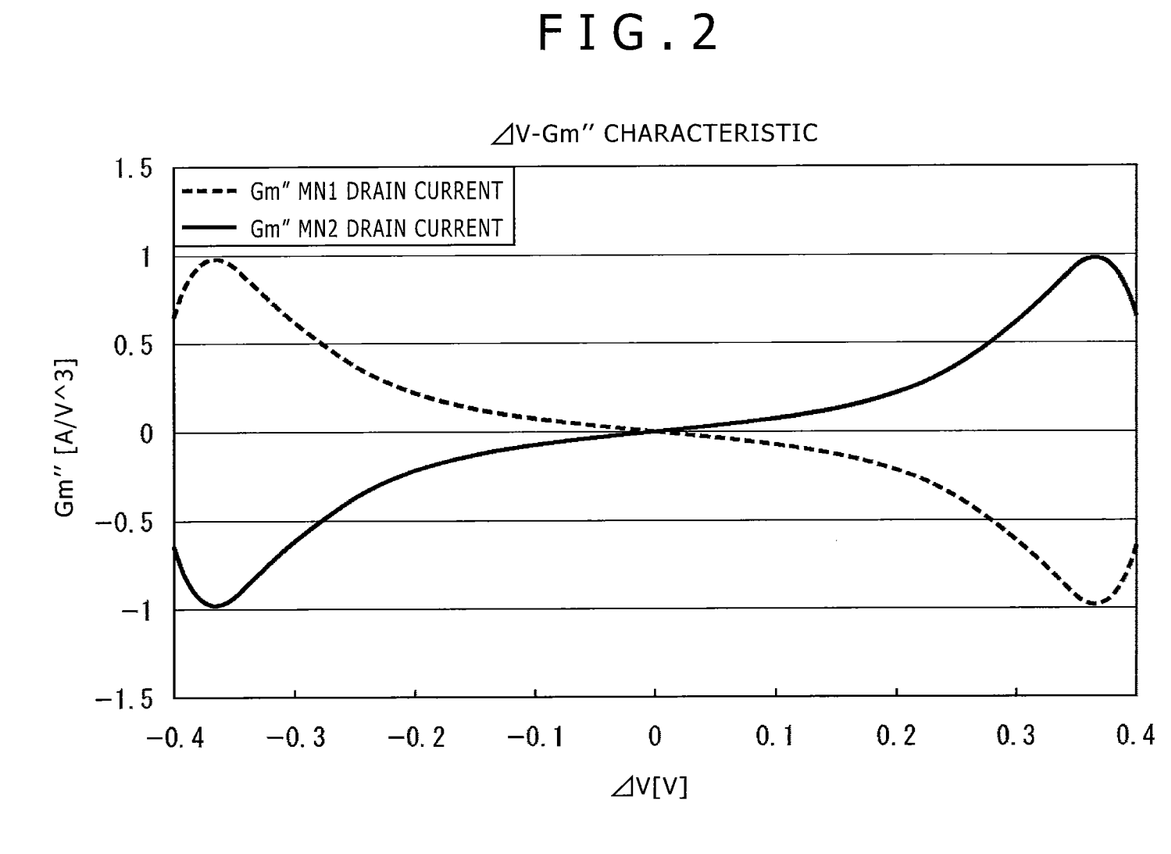
FIG. 2 is a diagram illustrating an example of a third order derivative of an output current with respect to an input voltage.

The variable gain amplifier 10 shown in FIG. 2 controls the ratio of signal current flowing into the output terminal by controlling the gate potential of the cascode transistor MN1, or that of the cascode transistor MN2 or those of both of the transistors, thus controlling the gain. At this time, the signal voltage generated by the source of the cascode transistor MN1 is given by Equation 1 shown below.

[Equation 1]

$$vs = vin \times gm_0 \times \left(\frac{1}{gm_1 + gm_2}\right) \quad (1)$$

It should be noted that "vin" in Equation 1 represents the input terminal voltage. Further, "$gm_0$" represents the mutual conductance of the transistor MN0, "$gm_1$" the mutual conductance of the transistor MN1, and "$gm_2$" the mutual conductance of the transistor MN2. The same holds true for the description given below.

On the other hand, an output current io is given by Equation 2 shown below.

[Equation 2]

$$io = vin \times gm_0 \times \left(\frac{1}{gm_1 + gm_2}\right) \times gm_1 \quad (2)$$

If the non-linearity of $gm_0$ is ignored, the output current io is a function of the mutual conductances gm of the transistors except for the case in which $gm_2=0$ or $gm_2=gm_1$. The gm values of the transistors vary non-linearly and dependently on the gate-to-source voltage. Therefore, there has been a likelihood that the gain control characteristic may vary non-linearly in the control process. This has resulted in insufficient distortion characteristic, possibly making it difficult to achieve a sufficient dynamic range.

1-2 Signal Processor

For this reason, a signal processor includes a plurality of variable gain amplification sections and a control section. The plurality of variable gain amplification sections with variable gains are connected in parallel. The control section controls the potentials of control terminals of each of the variable gain amplification sections and makes transitions in the control terminal potentials according to the input signal levels that are different from each other.

That is, a plurality of arbitrary variable gain amplification sections are connected in parallel. The state transitions in control terminal potentials of the arbitrary variable gain amplification sections are controlled by the control section in such a manner that there are predetermined potential differences therebetween. This minimizes distortion components generated by the variable gain amplification sections thanks to interference between these components, thus contributing to improved linearity of the gain control characteristic as a whole.

This signal processor may be of any type so long as an input signal is amplified and output by amplification sections with variable gains. The input signal may be of any type. Although the variable gain amplification sections may also be of arbitrary type, it is preferred that these parallel-connected sections should offer the same characteristic.

The control section may make transitions in the control terminal potentials of the variable gain amplification sections with potential differences established therebetween that allow the distortion components generated by the variable gain amplification sections to cancel out each other.

As described above, the control section makes transitions in the control terminal potentials with potential differences established therebetween, thus minimizing distortion components more efficiently.

The control section may make transitions in the control terminal potentials of the variable gain amplification sections at predetermined voltage intervals.

If the parallel-connected variable gain amplification sections offer the same characteristic, the control section can minimize the distortion components more efficiently by making transitions in the control terminal potentials of the variable gain amplification sections at predetermined voltage intervals that allow the distortion components to cancel out each other.

The control section may change each of the control terminal potentials by a potential difference proportional to the change in the signal level.

Further, all the variable gain amplification sections may include transistors of the same size.

Each of the variable gain amplification sections may include a pair of cascode transistors and vary the gain based on the current division ratio between the pair of cascode transistors. The control section may control the control terminal potentials in such a manner that the pair of cascode transistors are controlled in a differential manner.

Even if each of the variable gain amplification sections includes a pair of cascode transistors, the control section can provide improved linearity of the gain control characteristic as a whole by controlling the gate potential (control terminal potential) of each transistor in a differential manner and making transitions in the control terminal potentials of each of the variable gain amplification sections according to the input signal levels that are different from each other.

Each of the variable gain amplification sections may include a differential amplification section adapted to amplify the difference between the control terminal potentials.

Even if each of the variable gain amplification sections may be a differential amplification section adapted to amplify the difference between two inputs, the control section can provide improved linearity of the gain control characteristic as a whole by exercising the same control. Of course, each of the variable gain amplification sections may be an amplification section other than a differential amplification section.

It should be noted that the present technology may be implemented as a signal processing method rather than a signal processor.

Alternatively, the present technology may be implemented as a communication device that includes a reception section, a plurality of variable gain amplification sections and a control section. The reception section receives a signal. The plurality of variable gain amplification sections are connected in parallel and amplify the signal received by the reception section. The control section controls the potentials of control terminals of each of the variable gain amplification sections and makes transitions in the control terminal potentials according to the input signal levels that are different from each other.

That is, the present technology may be implemented as a signal processor or an arbitrary device adapted to perform the same signal processing. Alternatively, a part or whole of the control process may be implemented by software.

[1-3 Variable Gain Amplifier Including Amplification Sections Connected in Parallel]

If the drains of the transistors MN1 and MN2 of the variable gain amplifier 10 shown in FIG. 1 are shorted together, the output current io can be expressed by Equation 3 shown below.

[Equation 3]

$$io = vin \times gm_0 \times \left\{ \left( \frac{1}{gm_1 + gm_2} \right) \times (gm_1 + gm_2) \right\} \quad (3)$$

That is, the output current io is affected only by the non-linearity of $gm_0$. According to Equation 2, the drain current of each of the transistors MN1 and MN2 is non-linear with respect to the input voltage. According to Equation 3, however, if the drain currents of the two transistors are added up, a non-linearity is produced only by $gm_0$. That is, the non-linear component (e.g., mutual modulation distortion component) of the drain current of the transistor MN1 is identical in amplitude but opposite in phase to that of the drain current of the transistor MN2.

Further, as for Equation 2, assuming $gm_1=gm_2$, the output current is affected only by the non-linearity of $gm_0$. Still further, letting the difference in gate potential between the transistors MN1 and MN2 be denoted by $\Delta V[V]$, the non-linear component of the drain current of the transistor MN1 at $\Delta V[V]>0$ is opposite in phase to that at $\Delta V[V]<0$.

Here, letting the horizontal axis represent $\Delta V[V]$ and the vertical axis represent the third order derivative of the output current with respect to the input voltage, we obtain the graph shown in FIG. 2. That is, comparing the third order derivatives of the output currents with respect to the input voltage, that of the drain current of the transistor MN1 is symmetrical to that of the drain current of the transistor MN2 with respect to the point $\Delta V=0$.

Figure 3:
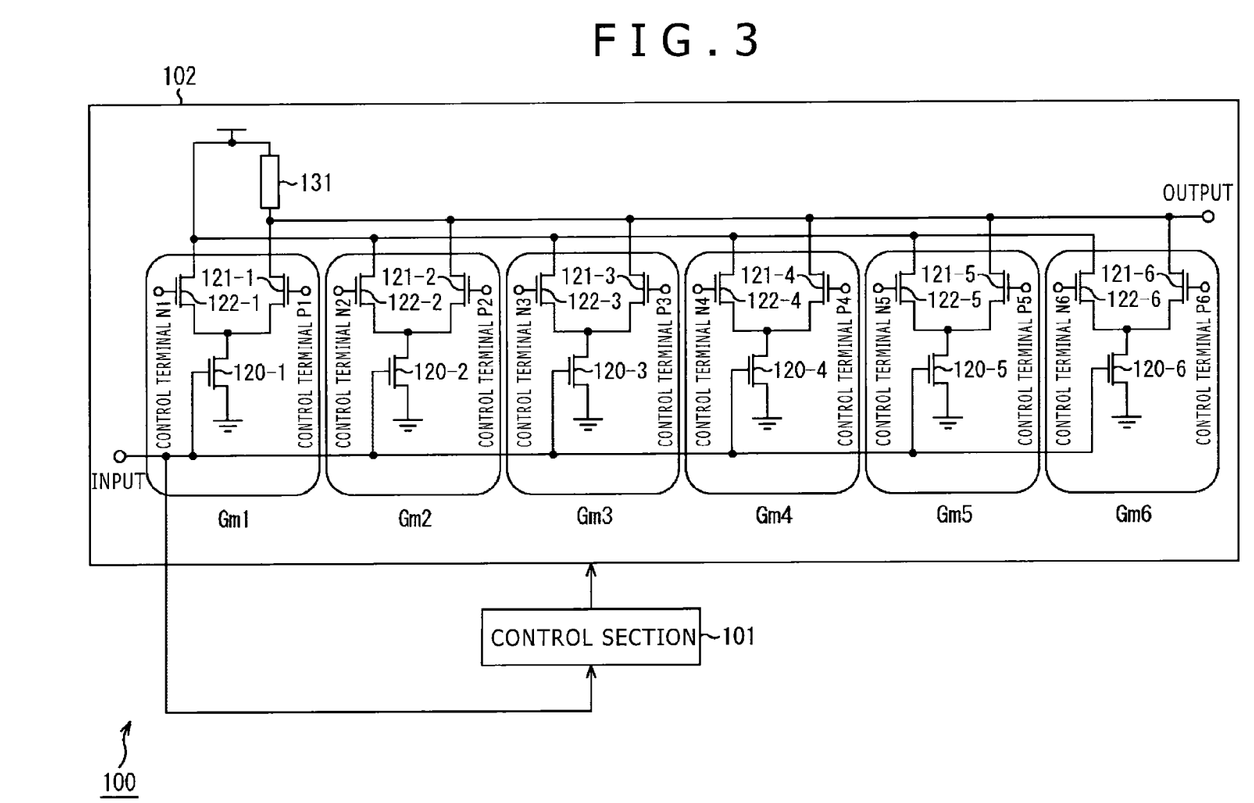
FIG. 3 is a diagram illustrating an example of main components of a variable gain amplifier.

FIG. 3 is a diagram illustrating an example of main components of a variable gain amplifier. A variable gain amplifier 100 shown in FIG. 3 is an amplifier with a variable gain as is the variable gain amplifier 10 shown in FIG. 1. The same amplifier 100 is an example of a signal processor adapted to process a signal. As illustrated in FIG. 3, the variable gain amplifier 100 includes a control section 101 and amplification section 102.

The control section 101 controls the gain of the amplification section 102 according to the input signal level.

The amplification section 102 is a variable gain amplification section adapted to amplify the input signal supplied through the input terminal with the gain controlled by the control section 101 and output the amplified signal.

As illustrated in FIG. 3, the amplification section 102 includes six amplification sections Gm1 to Gm6 and a load 131. The amplification sections Gm1 to Gm6 are connected in parallel between the input and output of the amplification section 102. That is, the same section 102 has parallel-connected amplification sections similar to the variable gain amplifier 10. That is, each of the amplification sections includes the pair of cascode transistors MN1 and MN2 that are connected to the common transistor MN0 and controls the ratio of signal current flowing into the output terminal by controlling the gate potential of the cascode transistor MN1, or that of the cascode transistor MN2 or those of both of the transistors, thus controlling the gain.

The amplification section Gm1 includes transistors 120-1, 121-1 and 122-1. The gate of the transistor 120-1 is connected to the input terminal. The gate of the transistor 121-1 is a control terminal P1, and the drain of this transistor is connected to the output terminal. The gate of the transistor 122-1 is a control terminal N1.

The amplification section Gm2 includes transistors 120-2, 121-2 and 122-2. The gate of the transistor 120-2 is connected to the input terminal. The gate of the transistor 121-2 is a control terminal P2, and the drain of this transistor is connected to the output terminal. The gate of the transistor 122-2 is a control terminal N2.

The amplification section Gm3 includes transistors 120-3, 121-3 and 122-3. The gate of the transistor 120-3 is connected to the input terminal. The gate of the transistor 121-3 is a control terminal P3, and the drain of this transistor is connected to the output terminal. The gate of the transistor 122-3 is a control terminal N3.

The amplification section Gm4 includes transistors 120-4, 121-4 and 122-4. The gate of the transistor 120-4 is connected to the input terminal. The gate of the transistor 121-4 is a control terminal P4, and the drain of this transistor is connected to the output terminal. The gate of the transistor 122-4 is a control terminal N4.

The amplification section Gm5 includes transistors 120-5, 121-5 and 122-5. The gate of the transistor 120-5 is connected to the input terminal. The gate of the transistor 121-5 is a control terminal P5, and the drain of this transistor is connected to the output terminal. The gate of the transistor 122-5 is a control terminal N5.

The amplification section Gm6 includes transistors 120-6, 121-6 and 122-6. The gate of the transistor 120-6 is connected to the input terminal. The gate of the transistor 121-6 is a control terminal P6, and the drain of this transistor is connected to the output terminal. The gate of the transistor 122-6 is a control terminal N6.

The above transistors 120-1 to 120-6 may all be of the same size, or some thereof may be of different sizes. If it is not necessary to distinguish between the transistors 120-1 to 120-6 in the description, these transistors will be simply referred to as the transistors 120. If it is not necessary to distinguish between the transistors 121-1 to 121-6 in the description, these transistors will be simply referred to as the transistors 121. If it is not necessary to distinguish between the transistors 122-1 to 122-6 in the description, these transistors will be simply referred to as the transistors 122. If it is not necessary to distinguish between the control terminals N1 to N6, these control terminals will be simply referred to as the control terminals N. If it is not necessary to distinguish between the control terminals P1 to P6, these control terminals will be simply referred to as the control terminals P. Further, if it is not necessary to distinguish between the amplification sections Gm1 to Gm6, these amplification sections will be simply referred to as the amplification sections Gmn.

As described above, the gate of the transistor 120 of each of the amplification sections Gmn is connected to the input terminal, and the drain of the transistor 121 thereof is connected to the output terminal. Further, the drains of the transistors 122 thereof are connected together.

It should be noted that the number of the amplification sections Gmn connected in parallel is arbitrary. The amplification sections Gmn are arbitrary ones and may be differential amplification sections adapted to amplify the potential difference between two inputs (a pair of inputs).

Figure 4:
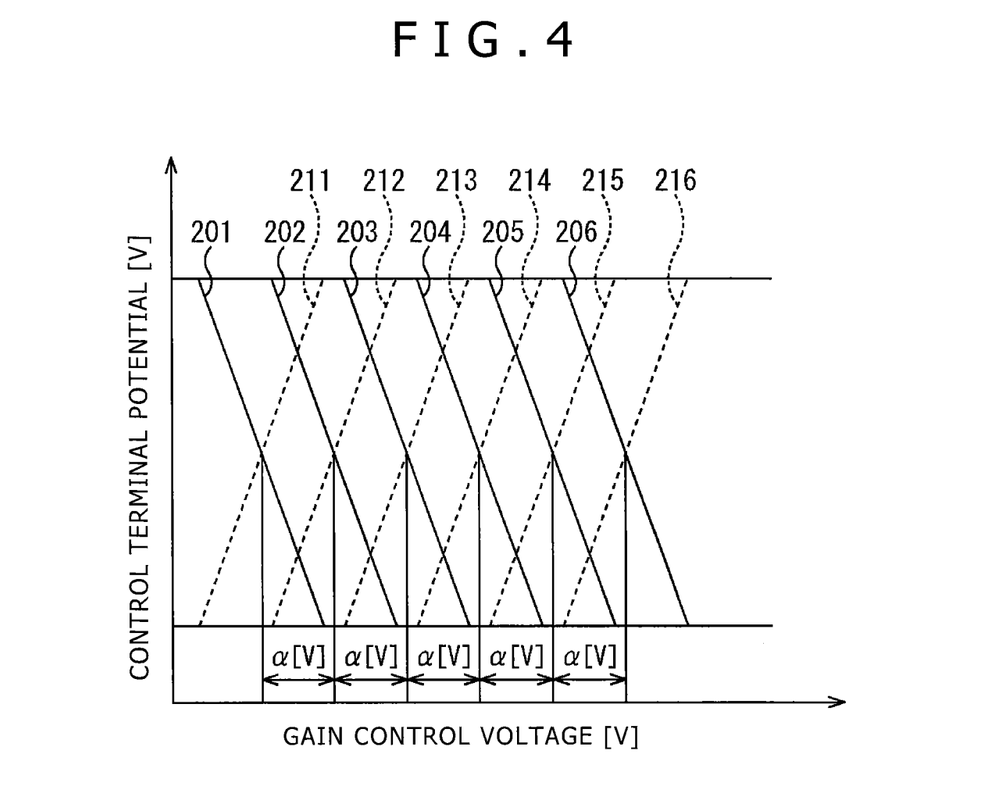
FIG. 4 is a diagram illustrating an example of control terminal potentials.

The control section 101 controls the potentials of the control terminals N and P of each of the amplification sections Gmn in a manner as shown, for example, in FIG. 4. The graph illustrated in FIG. 4 shows the relationship between the gain control voltage, i.e., the input signal level, and the potential of each of the control terminals.

In FIG. 4, a line 201 represents the manner in which the potential of the control terminal P1 makes transitions. It should be noted that the potential of the control terminal P1 is at high level when the input signal level is lower than the line 201 and at low level when the input signal level is higher than the line 201.

Further, a line 202 represents the manner in which the potential of the control terminal P2 makes transitions. It should be noted that the potential of the control terminal P2 is at high level when the input signal level is lower than the line 202 and at low level when the input signal level is higher than the line 202.

Still further, a line 203 represents the manner in which the potential of the control terminal P3 makes transitions. It should be noted that the potential of the control terminal P3 is at high level when the input signal level is lower than the line 203 and at low level when the input signal level is higher than the line 203.

Still further, a line 204 represents the manner in which the potential of the control terminal P4 makes transitions. It should be noted that the potential of the control terminal P4 is at high level when the input signal level is lower than the line 204 and at low level when the input signal level is higher than the line 204.

Still further, a line 205 represents the manner in which the potential of the control terminal P5 makes transitions. It should be noted that the potential of the control terminal P5 is at high level when the input signal level is lower than the line 205 and at low level when the input signal level is higher than the line 205.

Still further, a line 206 represents the manner in which the potential of the control terminal P6 makes transitions. It should be noted that the potential of the control terminal P6 is at high level when the input signal level is lower than the line 206 and at low level when the input signal level is higher than the line 206.

In FIG. 4, on the other hand, a line 211 represents the manner in which the potential of the control terminal N1 makes transitions. It should be noted that the potential of the control terminal N1 is at low level when the input signal level is lower than the line 211 and at high level when the input signal level is higher than the line 211.

Further, a line 212 represents the manner in which the potential of the control terminal N2 makes transitions. It should be noted that the potential of the control terminal N2 is at low level when the input signal level is lower than the line 212 and at high level when the input signal level is higher than the line 212.

Still further, a line 213 represents the manner in which the potential of the control terminal N3 makes transitions. It should be noted that the potential of the control terminal N3 is at low level when the input signal level is lower than the line 213 and at high level when the input signal level is higher than the line 213.

Still further, a line 214 represents the manner in which the potential of the control terminal N4 makes transitions. It should be noted that the potential of the control terminal N4 is at low level when the input signal level is lower than the line 214 and at high level when the input signal level is higher than the line 214.

Still further, a line 215 represents the manner in which the potential of the control terminal N5 makes transitions. It should be noted that the potential of the control terminal N5 is at low level when the input signal level is lower than the line 215 and at high level when the input signal level is higher than the line 215.

Still further, a line 216 represents the manner in which the potential of the control terminal N6 makes transitions. It should be noted that the potential of the control terminal N6 is at low level when the input signal level is lower than the line 216 and at high level when the input signal level is higher than the line 216.

As illustrated in FIG. 4, the control section 101 controls the potentials of the control terminals P and N of each of the amplification sections Gmn in a differential manner (in such a manner that the sum of the two potentials is constant). Further, the control section 101 makes transitions in the potentials of the control terminals at different levels for each of the amplification sections Gmn. For example, the control section 101 makes transitions in the control terminal potentials with an offset α[V] established for each of the amplification sections Gmn at predetermined voltage intervals. This offset should preferably be a voltage interval that allows the distortion components generated by the amplification sections Gmn to cancel out each other.

That is, the amplification sections Gmn serve as parallel-connected gain control amplifiers. Further, the gain control terminals of the amplification sections Gmn are controlled in a differential manner. Still further, the gate control voltages applied to the control terminals N and P of the amplification sections Gmn are offset from each other by ΔαV in such a manner that the distortion components generated by the cells of the amplification sections Gmn cancel out each other.

Figure 5:
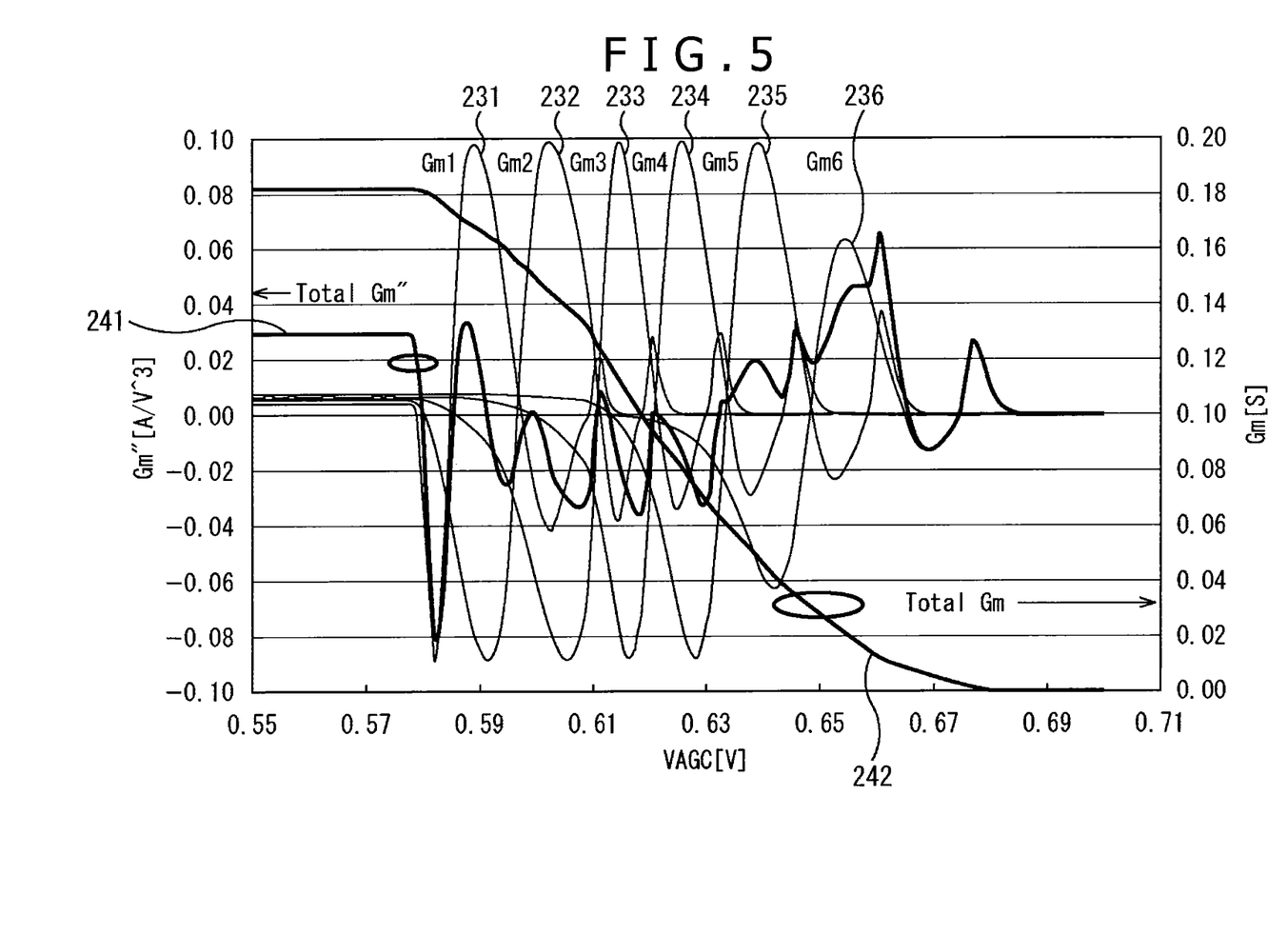
FIG. 5 is a diagram illustrating an example of a third order derivative of the output current with respect to the input voltage.

Letting the horizontal axis represent the gain control voltage (i.e., input signal level) of the amplification section 102 shown in FIG. 3 and the vertical axis represent the third order derivative of the output current with respect to the input signal level, we obtain the graph shown in FIG. 5. In FIG. 5, curves 231 to 236 represent the third order derivatives of the output currents with respect to the input signal level for the respective amplification sections Gmn. Further, a curve 241 represents the third order derivative of the output current with respect to the input signal level for the amplification section 102 as a whole. Still further, a curve 242 represents a mutual conductance Gm[S] with respect to the input signal level for the amplification section 102 as a whole.

As illustrated by the curve 241 shown in FIG. 5, the amplification sections Gmn cancel out the non-linearities of each other under control of the control section 101. That is, the plurality of gain control amplifiers operate while at the same time compensating for the distortion characteristics of each other, the variable gain amplifier 100 can improve distortion characteristic as compared to the variable gain amplifier 10 shown in FIG. 1.

Figure 6:
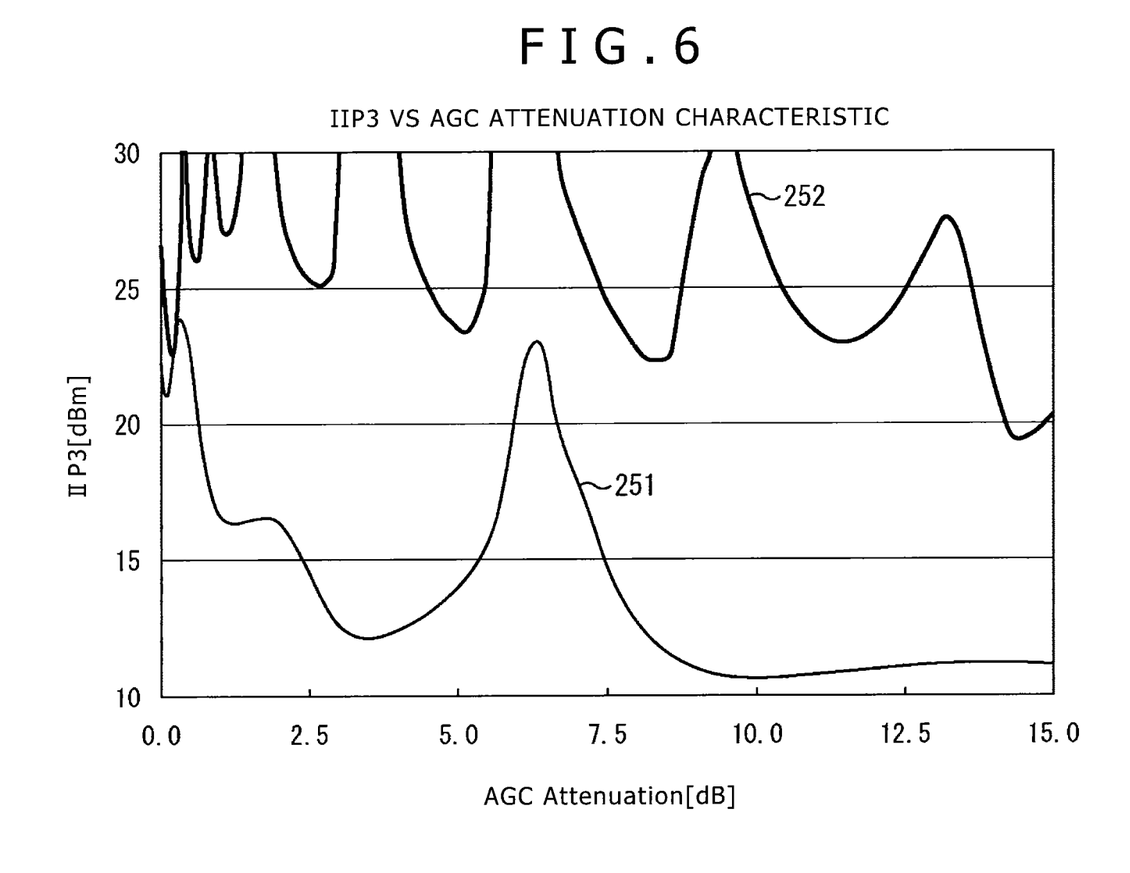
FIG. 6 is a diagram illustrating an example of a tertiary mutual distortion characteristic.

FIG. 6 is a diagram illustrating an example of a tertiary mutual distortion characteristic. A curve 251 shown in FIG. 6 represents an example of a tertiary mutual distortion characteristic (tertiary intercept point) with respect to the attenuation (AGC Attenuation) of the variable gain amplifier 10. Further, a curve 252 shown in FIG. 6 represents an example of a tertiary mutual distortion characteristic with respect to the attenuation of the variable gain amplifier 100.

As illustrated in FIG. 6, the curve 252 is higher than the curve 251 as a whole. That is, the variable gain amplifier 100 has a higher tertiary mutual distortion characteristic than the variable gain amplifier 10. Therefore, the variable gain amplifier 100 provides a better dynamic range than the variable gain amplifier 10.

It should be noted that the control section 101 may change each of the control terminal potentials by the potential difference proportional to the change in the signal level, that is, in an analog manner.

1-4 Flow of the Gate Control Process

Figure 7:
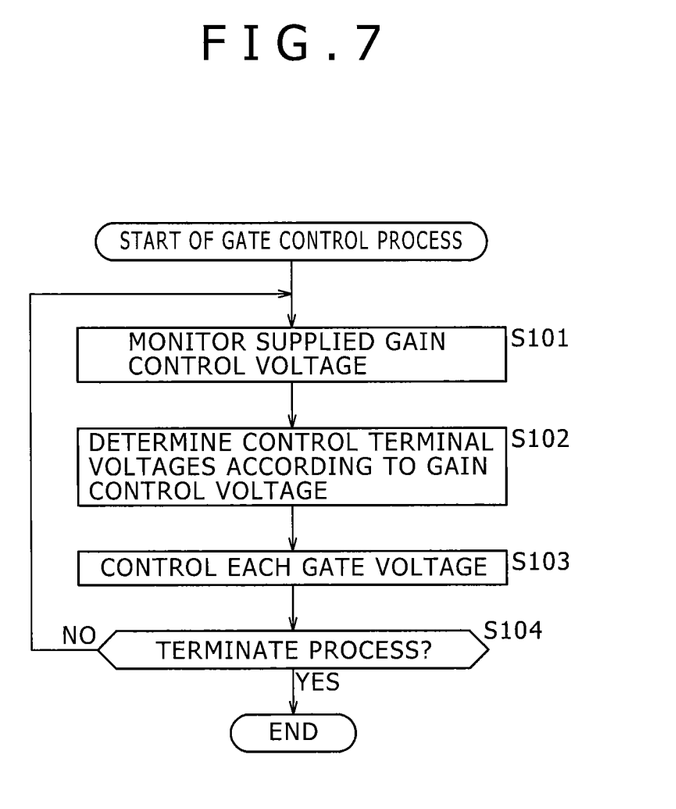
FIG. 7 is a flowchart illustrating an example of the flow of a gate control process.

A description will be given of an example of the gate control process handled by the control section 101 with reference to the flowchart shown in FIG. 7.

When the gate control process begins, the control section 101 monitors the input signal level in step S101. In step S102, the control section 101 determines the control terminal potentials according to the input signal level. In step S103, the control section 101 controls the control terminal potentials to be equal to the potentials determined in step S102.

In step S104, the control section 101 determines whether to terminate the gate control process. If it is determined that the process will not be terminated, the process returns to step S101 to repeat the subsequent steps. On the other hand, when it is determined in step S104 that the process will be terminated, the gate control process is terminated.

The gate control process handled by the control section 101 allows the control terminal potentials to be controlled as described above, thus contributing to a better dynamic range of the variable gain amplifier 100 than that of the variable gain amplifier 10.

2. Second Embodiment

Figure 8:
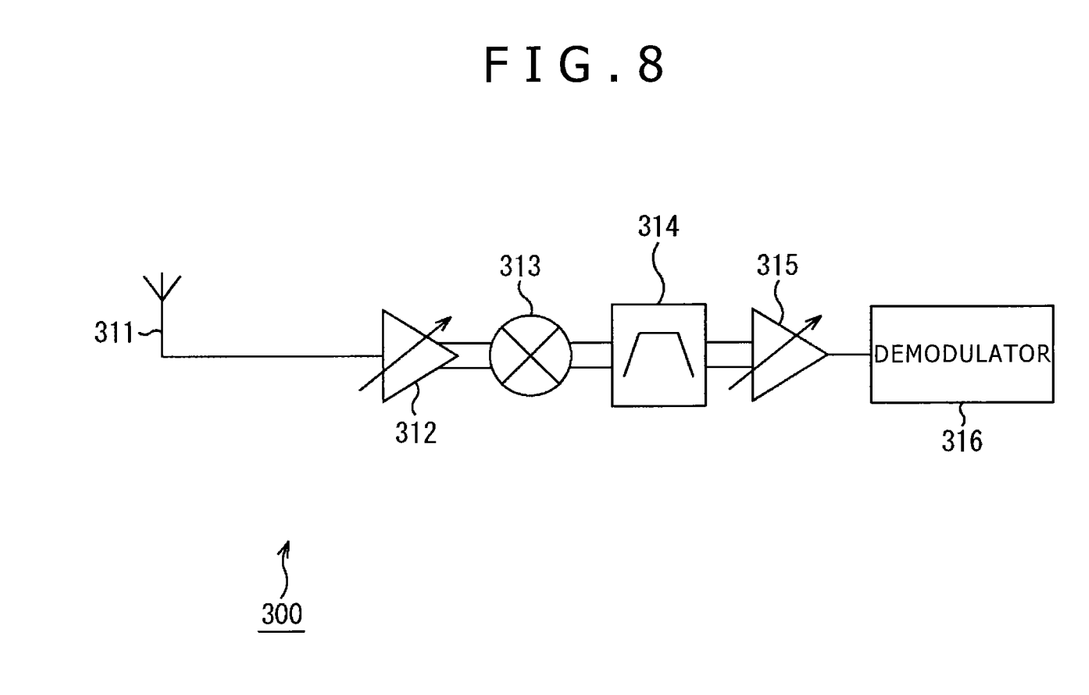
FIG. 8 is a diagram illustrating an example of main components of a receiver.

It should be noted that the present technology is applicable to an arbitrary device having the same functionalities as the variable gain amplifier 100 shown in FIG. 3. For example, the present technology is applicable to a receiver using the variable gain amplifier 100. FIG. 8 is a diagram illustrating an example of main components of the receiver.

A receiver 300 shown in FIG. 8 receives broadcasting waves such as TV signal. As illustrated in FIG. 8, the receiver 300 includes an antenna 311, variable gain amplifier (variable gain AMP) 312, mixer (MIXER) 313, band-pass filter (BPF) 314, variable gain amplifier (IFVGA) 315 and demodulation section (DEMODULATOR) 316.

In the receiver configured as described above, the variable gain amplifier 100 shown in FIG. 3 is used as the variable gain amplifier 312. This makes it possible for the same amplifier 312 to control the gain of the reception signal (TV signal) received via the antenna 311 according to the signal level. As a result, the variable gain amplifier 312 can amplify the reception signal while at the same time minimizing the distortion.

At this time, the variable gain amplifier 312 provides improved linearity of the gain control characteristic of the amplification section. That is, the same amplifier 312 offers better distortion characteristic, thus contributing to improved dynamic range of the receiver 300.

It should be noted that the signals received by the receiver 300 may be wireless or wired signals.

The present technology is further applicable to other devices.

3. Third Embodiment

Display Device

Figure 9:
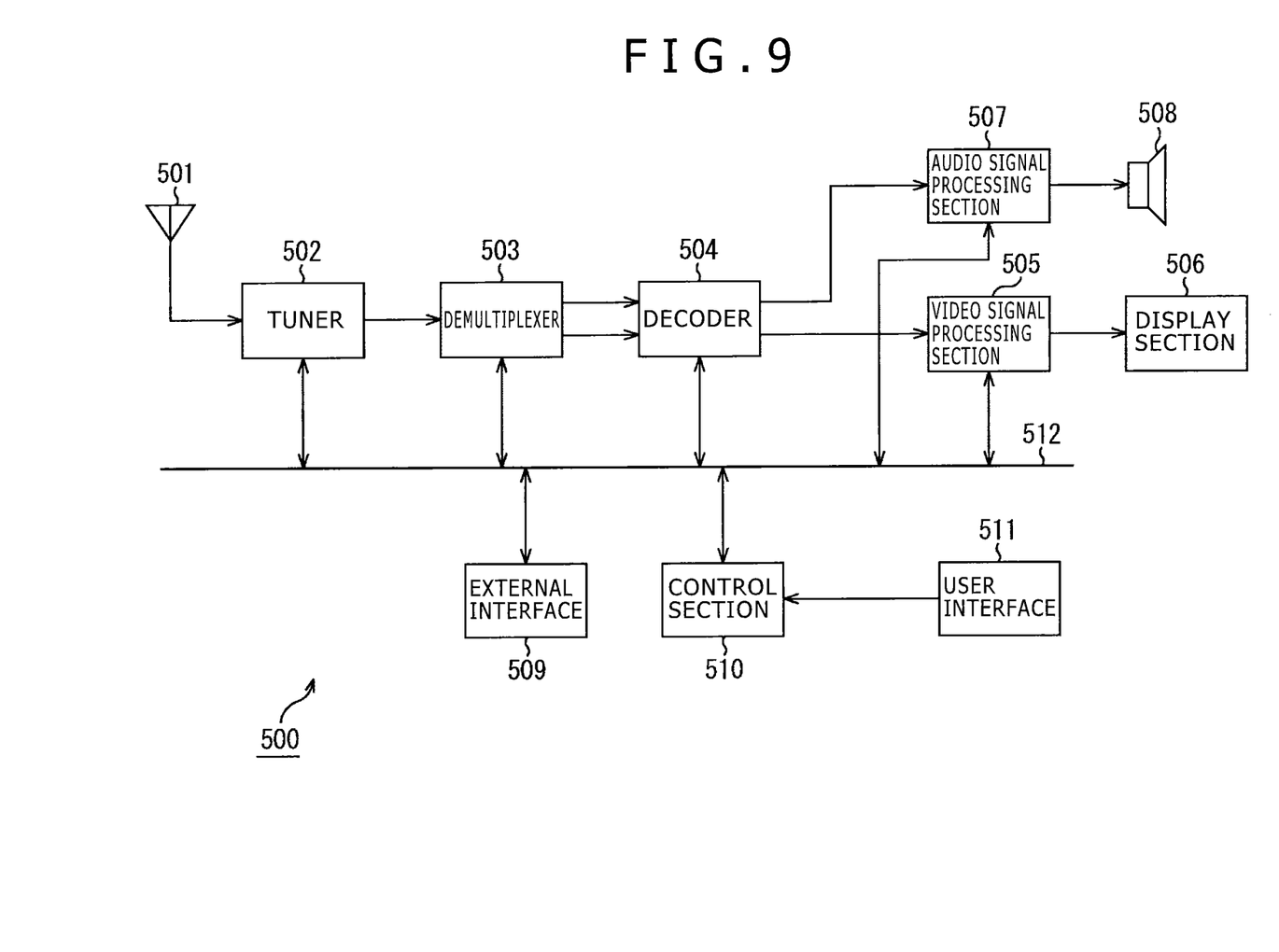
FIG. 9 is a block diagram illustrating an example of main components of a display device.

FIG. 9 is a block diagram illustrating an example of main components of a display device using the above receiver (receiver 300) as its processing sections. A display device 500 shown in FIG. 9 is, for example, a receiver adapted to receive AM broadcasting waves (e.g., television signal) such as SECAM-L and also a display device adapted to display received images. The display device 500 includes, for example, an antenna 501, tuner 502, demultiplexer 503, decoder 504, video signal processing section 505, display section 506, audio signal processing section 507, speaker 508, external interface 509, control section 510, user interface 511 and bus 512.

The tuner 502 extracts the signal of a desired channel from the broadcasting signal received via the antenna, demodulating the extracted signal. Then, the tuner 502 outputs the coded bit stream, obtained from the demodulation, to the demultiplexer 503. That is, the tuner 502 serves as a transmission section of the display device 500 adapted to receive a coded stream containing coded images.

The demultiplexer 503 separates the video and audio streams of the program to be viewed from the coded bit stream, outputting the separated streams to the decoder 504. Further, the demultiplexer 503 extracts auxiliary data such as EPG (Electronic Program Guide) from the coded bit stream, supplying the extracted data to the control section 510. It should be noted that the demultiplexer 503 may descramble the coded bit stream if this stream is scrambled.

The decoder 504 decodes the video and audio streams supplied from the demultiplexer 503. Then, the decoder 504 outputs the video data, generated by the decoding, to the video signal processing section 505. Further, the decoder 504 outputs the audio data, generated by the decoding, to the audio signal processing section 507.

The video signal processing section 505 reproduces the video data supplied from the decoder 504, allowing the display section 506 to display the picture. Alternatively, the same section 505 may allow the display section 506 to display an application screen supplied via a network. Still alternatively, the video signal processing section 505 may perform an additional process on the video data such as noise removal according to the setup. Still alternatively, the same section 505 may generate GUI (Graphical Use Interface) images such as menus, buttons or cursor and overlay the generated image on the output image.

The display section 506 is driven by a drive signal supplied from the video signal processing section 505, displaying a picture or image on the picture surface of a display device (e.g., liquid crystal display, plasma display or OELD (Organic ElectroLuminescence Display)).

The audio signal processing section 507 performs a reproduction process including conversion of the digital audio data supplied from the decoder 504 to analog data and amplification of the same data, outputting the sound from the speaker 508. Alternatively, the audio signal processing section 507 may perform an additional process on the audio data including noise removal.

The external interface 509 connects the display device 500 and external equipment or network. For example, a video or audio stream received via the external interface 509 may be decoded by the decoder 504. That is, the external interface 509 also serves as a transmission section of the display device 500 adapted to receive a coded stream containing coded images.

The control section 510 includes a processor such as CPU (Central Processing Unit) and memory such as RAM (Random Access Memory) and ROM (Read Only Memory). The memory stores a program executed by the CPU, program data, EPG data and data acquired via a network. The program stored in the memory is read and executed by the CPU, for example, when the display device 500 is activated. The CPU controls the operation of the display device 500, for example, according to an operation signal supplied from the user interface 511 by executing the program.

The user interface 511 is connected to the control section 510. The same interface 511 includes, for example, buttons, switches and a remote control signal reception section that allows the user to operate the display device 500. The user interface 511 detects a user operation via these components, generating an operation signal and outputting the generated operation signal to the control section 510.

The bus 512 connects the tuner 502, demultiplexer 503, decoder 504, video signal processing section 505, audio signal processing section 507, external interface 509 and control section 510 together.

The receiver 300 described above is used as the antenna 501 and tuner 502 of the display device 500 configured as described above. This provides a better dynamic range of the tuner 502, thus contributing to improved quality of the on-screen image.

4. Fourth Embodiment

Computer

The above series of processes may be performed by hardware or software. If the series of processes are performed by software, the program making up the software is installed to a computer. Here, the computer includes a computer incorporated in dedicated hardware, a general-purpose personal computer capable of performing various functions when installed with various programs or other computer.

Figure 10:
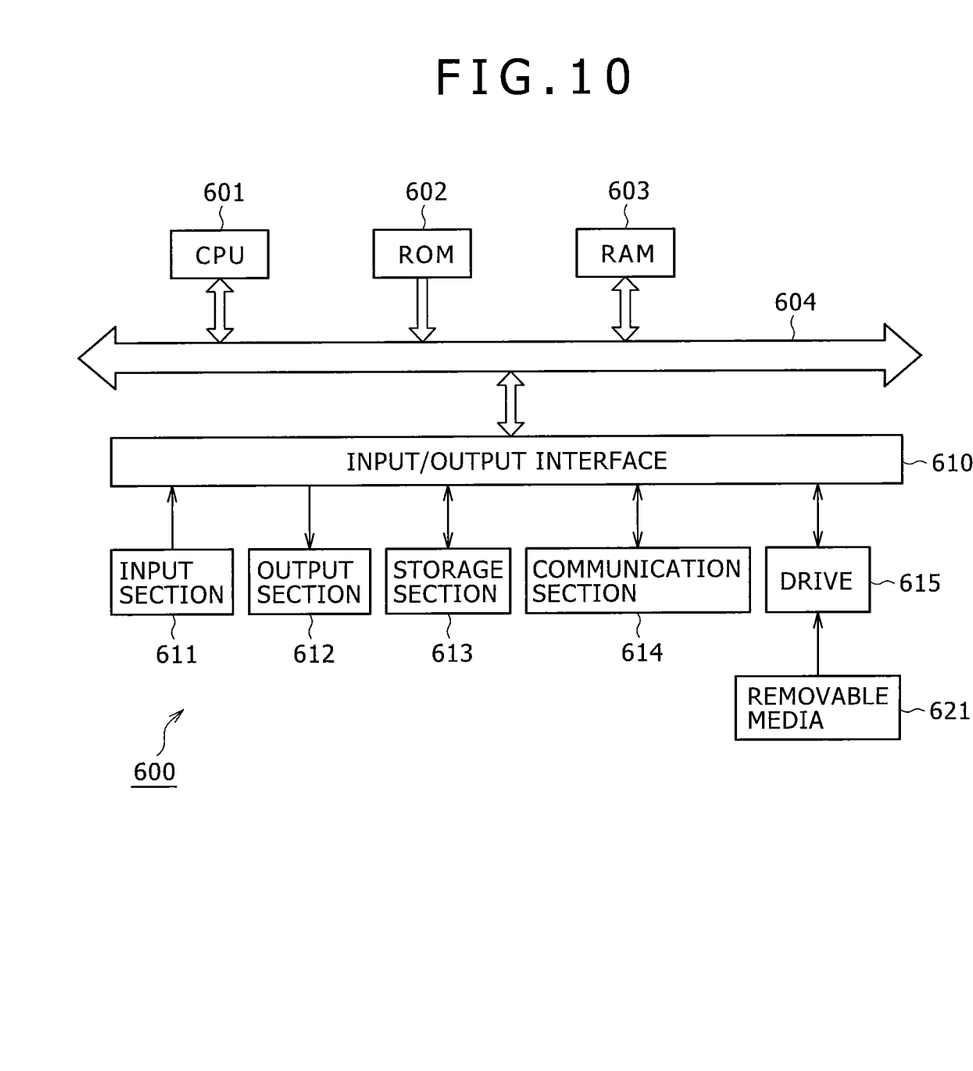
FIG. 10 is a block diagram illustrating an example of main components of a computer.

FIG. 10 is a block diagram illustrating a hardware configuration example of a computer adapted to perform the above series of processes using a program.

In a computer 600 shown in FIG. 10, a CPU 601, ROM 602 and RAM 603 are connected to each other via a bus 604.

An Input/output interface 610 is also connected to the bus 604. An input section 611, output section 612, storage section 613 and communication section 614 and drive 615 are connected to the Input/output interface 610.

The input section 611 includes, for example, a keyboard, mouse, microphone, touch panel and input terminals. The output section 612 includes, for example, a display, speaker and output terminals. The storage section 613 includes, for example, a hard disk, RAM disk and non-volatile memory. The communication section 614 includes, for example, a network interface. The drive 615 drives a removable media 621 such as magnetic disk, optical disk, magneto-optical disk, or semiconductor memory.

In the computer configured as described above, the CPU 601 loads the program from the storage section 613 into the RAM 603 for execution via the Input/output interface 610 and bus 604, thus allowing for the above series of processes to be performed. The RAM 603 also stores, as appropriate, data necessary for the CPU 601 to perform a variety of processes.

The program executed by the computer (CPU 601) can be used in a manner recorded on the removable media 621 such as package media. Alternatively, the program may be supplied via a wired or wireless transmission media such as local area network, the Internet or digital satellite broadcasting.

In the computer, the program can be installed to the storage section 613 via the Input/output interface 610 by inserting the removable media 621 into the drive 615. Alternatively, the program can be installed to the storage section 613 by receiving the program via a wired or wireless transmission media with the communication section 614. In addition to the above, the program can be installed in advance to the ROM 602 or storage section 613.

It should be noted that the program executed by the computer may perform the processes not only chronologically according to the sequence described in the present specification but also in parallel or when necessary as when invoked.

Further, in the present specification, the steps describing the program recorded on the recording media include not only the processes performed chronologically according to the described sequence but also those that are not necessarily performed chronologically but in parallel or individually.

Still further, the term "system" in the present specification refers to a collection of a plurality of constituent elements (e.g., devices and modules (parts)), and whether all the constituent elements are housed in the same enclosure does not matter. Therefore, a plurality of devices housed in separate enclosures and connected together via a network, and a single device whose plurality of modules are housed in a single enclosure, are both systems.

Still further, the components described as a single device (or processing section) may be divided for use as a plurality of devices (or processing sections). Conversely, the components described above as a plurality of devices (or processing sections) may be combined for use as a single device (or processing section). Still further, components other than those of each of the above devices (or processing sections) may be added. Still further, part of the components of a device (or processing section) may be included in the components of other device (or processing section) if the components and operation of the system as a whole substantially remain unchanged.

While the preferred embodiments of the present disclosure have been described in detail above with reference to the accompanying drawings, the technical scope of the present disclosure is not limited to these examples. It is apparent that those having ordinary knowledge in the art in the technical field of the present disclosure will be able to devise various alterations or modifications within the scope of the technical idea described in the appended claims, and these alterations or modifications are naturally also to be construed as belonging to the technical scope of the present disclosure.

For example, the present technology can be in the form of cloud computing in which a single functionality is handled by a plurality of devices via a network in a shared and collaborative manner.

Further, each of the steps described in the above flowchart can be performed not only by a single device but also by a plurality of devices in a shared manner.

Still further, if a single step includes a plurality of processes, the plurality of processes included in the single step may be performed not only by a single device but also by a plurality of devices in a shared manner.

It should be noted that the present technology may have the following configurations.

(1) A signal processor including:
a plurality of parallel-connected variable gain amplification sections with variable gains; and
a control section adapted to control the potentials of control terminals of each of the variable gain amplification sections and make transitions in the control terminal potentials according to different input signal levels.

(2) The signal processor of feature (1), in which
the control section makes transitions in the control terminal potentials of the variable gain amplification sections with potential differences established therebetween that allow the distortion components generated by the variable gain amplification sections to cancel out each other.

(3) The signal processor of feature (1) or (2), in which
the control section makes transitions in the control terminal potentials of the variable gain amplification sections at predetermined voltage intervals.

(4) The signal processor of any one of features (1) to (3), in which
the control section changes each of the control terminal potentials by the potential difference proportional to the change in the signal level.

(5) The signal processor of any one of features (1) to (4), in which
all the variable gain amplification sections include transistors of the same size.

(6) The signal processor of any one of features (1) to (5), in which
each of the variable gain amplification sections includes a pair of cascode transistors and varies the gain based on the current division ratio between the pair of cascode transistors, and
the control section controls the control terminal potentials in such a manner that the pair of cascode transistors are controlled in a differential manner.

(7) The signal processor of feature (6), in which
each of the variable gain amplification sections includes a differential amplification section adapted to amplify the difference between the pair of control terminal potentials.

(8) A signal processing method of a signal processor causing the signal processor to:
monitor the input signal level;
determine the potentials of control terminals of each of a plurality of parallel-connected variable gain amplification sections with variable gains based on the signal level; and
supply the control terminal potentials to the control terminals of the variable gain amplification sections.

(9) A communication device including:
a reception section adapted to receive a signal;
a plurality of variable gain amplification sections that are connected in parallel and amplify the signal received by the reception section; and
a control section adapted to control the potentials of control terminals of each of the variable gain amplification sections and make transitions in the control terminal potentials according to the input signal levels that are different from each other.

The present disclosure contains subject matter related to that disclosed in Japanese Priority Patent Application JP 2012-120417 filed in the Japan Patent Office on May 28, 2012, the entire content of which is hereby incorporated by reference.

What is claimed is:

1. A signal processor comprising:
a plurality of parallel-connected variable gain amplification sections with variable gains; and
a control section adapted to control potentials of control terminals of each of the variable gain amplification sections and make transitions in the control terminal potentials according to different input signal levels, wherein a potential of at least one control terminal of each of the variable gain amplification sections is transitioned to a level higher than a predetermined voltage level in an event of an input signal level, corresponding to the at least one control terminal, lower than the predetermined voltage level.

2. The signal processor of claim 1, wherein
the control section makes transitions in the control terminal potentials of the variable gain amplification sections with potential differences established therebetween that allow the distortion components generated by the variable gain amplification sections to cancel out each other.

3. The signal processor of claim 1 wherein
the control section makes transitions in the control terminal potentials of the variable gain amplification sections at predetermined voltage intervals.

4. The signal processor of claim 1, wherein
the control section changes each of the control terminal potentials by the potential difference proportional to the change in the signal level.

5. The signal processor of claim 1, wherein
all the variable gain amplification sections include transistors of the same size.

6. The signal processor of claim 1, wherein
each of the variable gain amplification sections includes a pair of cascode transistors and varies the gain based on the current division ratio between the pair of cascode transistors, and
the control section controls the control terminal potentials in such a manner that the pair of cascode transistors are controlled in a differential manner.

7. The signal processor of claim 6, wherein
each of the variable gain amplification sections includes a differential amplification section adapted to amplify the difference between the pair of control terminal potentials.

8. A signal processing method of a signal processor causing the signal processor to:
monitor an input signal level;
make transitions in potentials of control terminals of each of a plurality of parallel-connected variable gain amplification sections based on the input signal level, wherein a potential of at least one control terminal of each of the variable gain amplification sections is transitioned to a level higher than a predetermined voltage level in an event of the input signal level lower than the predetermined voltage level; and
supply the control terminal potentials to the control terminals of the variable gain amplification sections.

9. A communication device comprising:
a reception section adapted to receive a signal;
a plurality of variable gain amplification sections that are connected in parallel and amplify the signal received by the reception section; and
a control section adapted to control potentials of control terminals of each of the variable gain amplification sections and make transitions in the control terminal potentials according to input signal levels that are different from each other, wherein a potential of at least one control terminal of each of the variable gain amplification sections is transitioned to a level higher than a predetermined voltage level in an event of an input signal level, corresponding to the at least one control terminal, lower than the predetermined voltage level.

* * * * *